United States Patent
Maillard et al.

(10) Patent No.: US 9,825,632 B1
(45) Date of Patent: Nov. 21, 2017

(54) CIRCUIT FOR AND METHOD OF PREVENTING MULTI-BIT UPSETS INDUCED BY SINGLE EVENT TRANSIENTS

(71) Applicant: Xilinx, Inc., San Jose, CA (US)

(72) Inventors: Pierre Maillard, San Jose, CA (US); Michael J. Hart, Palo Alto, CA (US); Praful Jain, Leuven (BE); Robert I. Fu, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/228,981

(22) Filed: Aug. 4, 2016

(51) Int. Cl.
*H03K 19/003* (2006.01)
*H03K 19/177* (2006.01)

(52) U.S. Cl.
CPC ... *H03K 19/00315* (2013.01); *H03K 19/1776* (2013.01); *H03K 19/17728* (2013.01)

(58) Field of Classification Search
CPC .......... H03K 19/003; H03K 19/00392; H03K 19/17764
USPC ....................... 326/9–10, 112–113
See application file for complete search history.

(56) References Cited

U.S. PATENT DOCUMENTS

| | | | | |
|---|---|---|---|---|
| 5,111,429 A | * | 5/1992 | Whitaker | G11C 11/4125 257/E27.099 |
| 6,127,864 A | * | 10/2000 | Mavis | H03K 3/0375 327/144 |
| 6,362,676 B1 | * | 3/2002 | Hoffman | G06F 1/06 327/293 |
| 6,637,005 B1 | * | 10/2003 | Kohnen | G06F 11/183 326/11 |
| 6,683,932 B1 | * | 1/2004 | Wood | H03K 5/15093 327/115 |
| 6,822,894 B1 | | 11/2004 | Costello et al. | |
| 6,903,571 B1 | | 6/2005 | Trimberger | |
| 6,982,451 B1 | | 1/2006 | Voogel et al. | |
| 7,036,059 B1 | | 4/2006 | Carmichael et al. | |
| 7,064,574 B1 | | 6/2006 | Voogel et al. | |
| 7,071,749 B2 | * | 7/2006 | Gardner | H03K 3/0375 327/202 |
| 7,109,746 B1 | | 9/2006 | Voogel et al. | |
| 7,111,215 B1 | | 9/2006 | Keller et al. | |
| 7,139,190 B1 | | 11/2006 | de Jong | |
| 7,143,329 B1 | | 11/2006 | Trimberger et al. | |
| 7,212,448 B1 | | 5/2007 | Trimberger | |
| 7,236,000 B1 | | 6/2007 | Steiner | |
| 7,249,010 B1 | | 7/2007 | Sundararajan et al. | |
| 7,250,786 B1 | | 7/2007 | Trimberger | |
| 7,266,020 B1 | | 9/2007 | Trimberger | |

(Continued)

*Primary Examiner* — Jason M Crawford
(74) *Attorney, Agent, or Firm* — John J. King

(57) ABSTRACT

A circuit for preventing multi-bit upsets induced by single event transients is described. The circuit comprises a clock generator configured to generate a first clock signal and a second clock signal; a first memory element configured to receive a first input signal and generate a first output signal, the first memory element having a first clock input configured to receive the first clock signal; and a second memory element configured to receive the first output signal and generate a second output signal, the second memory element having a second clock input configured to receive the second clock signal; wherein the first clock signal is the same as the second clock signal. A method of preventing multi-bit upsets induced by single event transients is also described.

16 Claims, 6 Drawing Sheets

(56) References Cited

U.S. PATENT DOCUMENTS

| | | | |
|---|---|---|---|
| 7,278,076 B2 * | 10/2007 | Zhang | G01R 31/31816 714/703 |
| 7,283,409 B1 | 10/2007 | Voogel et al. | |
| 7,298,168 B1 | 11/2007 | Steiner | |
| 7,310,759 B1 | 12/2007 | Carmichael et al. | |
| 7,383,479 B1 | 6/2008 | Carmichael et al. | |
| 7,386,826 B1 | 6/2008 | Keller et al. | |
| 7,409,610 B1 | 8/2008 | Drimer | |
| 7,452,765 B1 | 11/2008 | Voogel et al. | |
| 7,512,871 B1 | 3/2009 | Carmichael et al. | |
| 7,515,452 B1 | 4/2009 | de Jong et al. | |
| 7,525,362 B1 | 4/2009 | Lesea et al. | |
| 7,535,213 B1 | 5/2009 | Lesea | |
| 7,539,914 B1 | 5/2009 | Sundararajan et al. | |
| 7,550,858 B1 | 6/2009 | Drimer | |
| 7,589,558 B1 | 9/2009 | Tseng et al. | |
| 7,596,744 B1 * | 9/2009 | Kow | G06F 11/1004 714/819 |
| 7,620,883 B1 | 11/2009 | Carmichael et al. | |
| 7,626,415 B1 | 12/2009 | Tseng et al. | |
| 7,638,822 B1 | 12/2009 | deJong et al. | |
| 7,650,585 B1 | 1/2010 | Miller et al. | |
| 7,684,232 B1 | 3/2010 | Lesea | |
| 7,701,247 B1 | 4/2010 | Nelson | |
| 7,764,081 B1 | 7/2010 | Tuan et al. | |
| 7,795,900 B1 | 9/2010 | Lesea et al. | |
| 7,852,107 B1 | 12/2010 | Sundararajan | |
| 7,852,108 B1 | 12/2010 | Lesea | |
| 7,907,461 B1 | 3/2011 | Nguyen et al. | |
| 7,958,394 B1 | 6/2011 | Bridgford | |
| 7,990,173 B1 * | 8/2011 | Tseng | H03K 19/0033 326/11 |
| 8,014,184 B1 | 9/2011 | Lesea | |
| 8,065,644 B1 | 11/2011 | Jacobson et al. | |
| 8,099,625 B1 | 1/2012 | Tseng et al. | |
| 8,121,150 B1 | 2/2012 | Nelson | |
| 8,122,239 B1 | 2/2012 | James-Roxby et al. | |
| 8,136,073 B1 | 3/2012 | Srinivasan et al. | |
| 8,355,478 B1 * | 1/2013 | Seefeldt | H03L 7/08 375/355 |
| 8,375,338 B1 | 2/2013 | Hussein et al. | |
| 8,384,418 B1 * | 2/2013 | Lu | H03K 19/007 326/11 |
| 8,407,653 B1 | 3/2013 | Schumacher et al. | |
| 8,410,605 B2 | 4/2013 | Hart | |
| 8,516,339 B1 | 8/2013 | Lesea et al. | |
| 8,692,381 B1 | 4/2014 | Hart | |
| 8,713,409 B1 | 4/2014 | Tseng et al. | |
| 8,773,929 B1 | 7/2014 | Lesea | |
| 8,913,455 B1 | 12/2014 | Camarota | |
| 8,922,242 B1 | 12/2014 | Tseng et al. | |
| 8,954,806 B2 | 2/2015 | Dan et al. | |
| 8,972,833 B1 | 3/2015 | Rahul et al. | |
| 8,972,835 B1 | 3/2015 | Rahul et al. | |
| 8,975,913 B2 | 3/2015 | Smith | |
| 8,981,491 B1 | 3/2015 | Hart et al. | |
| 8,981,810 B1 | 3/2015 | Trimberger et al. | |
| 9,000,529 B1 | 4/2015 | Jain et al. | |
| 9,054,684 B1 | 6/2015 | Sood et al. | |
| 9,058,853 B2 | 6/2015 | Hart et al. | |
| 9,183,338 B1 | 11/2015 | Jain et al. | |
| 9,236,353 B2 | 1/2016 | Jain et al. | |
| 9,236,354 B2 | 1/2016 | Maillard et al. | |
| 2001/0028269 A1 * | 10/2001 | Shuler, Jr. | H03K 3/356165 327/277 |
| 2001/0030567 A1 * | 10/2001 | Wood | G06F 1/04 327/291 |
| 2007/0090887 A1 * | 4/2007 | Seefeldt | H03D 13/004 331/17 |
| 2010/0039135 A1 * | 2/2010 | Miyazaki | H03K 3/0375 326/9 |
| 2011/0022908 A1 * | 1/2011 | Wang | G01R 31/31816 714/726 |

* cited by examiner

CIRCUIT FOR AND METHOD OF PREVENTING MULTI-BIT UPSETS INDUCED BY SINGLE EVENT TRANSIENTS

TECHNICAL FIELD

The present invention relates generally to integrated circuits, and in particular, to a circuit for and a method of preventing multi-bit upsets induced by single event transient.

BACKGROUND

Programmable logic devices (PLDs) are a type of integrated circuit that enable the downloading of configuration bits to implement a user's circuit designs. PLDs include various memory elements, as will be described in more detail below. Configuration random access memory (CRAM), including configurable logic element memory (CLEM) are subject to upset from cosmic neutrons, thermal neutrons and terrestrial alpha particles. The failure rate associated with this is commonly known as Soft Error Rate (SER). The industrial metric used to quantify the SER of the circuit is known as FIT rate or FIT/Mb when normalized to device's size. SEU enhanced solutions are used to reduce SEU upsets in CLEM elements. Multi-bit upsets (MBUs) are events in which two or more error bits occur in the same word. With the adequate interleaving strategy and ECC scheme they are expected to be correctable.

In an ASIC or FPGA, a single ion strike may cause one or more voltage pulses/glitches to propagate through the circuit. The glitches are called single-event transients (SETs). If a SET propagates through the logic and induces a corrupted logic state to be latched in a memory cell, the SET is then considered an SEU and can results in an increase of the integrated circuit or FPGA FIT rate. SETs in a shift register latch (SRL) clock circuit have been identified as a source of abnormally large MBUs in CLEM logic by allowing erroneous data to be latched in given lookup table RAM (LUTRAM) arrays. These SET induced MBUs are larger than the cell interleaving size and therefore are uncorrectable. SETs in CLEM elements increase the FPGA FIT rate and force the user to reconfigure the FPGA.

SUMMARY

A circuit for preventing multi-bit upsets induced by single event transients is described. The circuit comprises a clock generator configured to generate a first clock signal and a second clock signal; a first memory element configured to receive a first input signal and generate a first output signal, the first memory element having a first clock input configured to receive the first clock signal; and a second memory element configured to receive the first output signal and generate a second output signal, the second memory element having a second clock input configured to receive the second clock signal; wherein the first clock signal is the same as the second clock signal.

A method of preventing multi-bit upsets induced by single event transients is also described. The method comprises generating a first clock signal and a second clock signal, wherein the first clock signal is the same as the second clock signal; receiving a first input signal at a first memory element; generating a first output signal at an output of the first memory element in response to the first clock signal; receiving the first output of the first memory element at a second memory element; receiving the second clock signal at a clock input of the second memory element; and generating a second output signal.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below eliminate or reduce the probability of uncorrectable multiple-bit upsets (MBUs) induced by single event transients (SETs) in CLEM elements. The circuits and methods generally include an additional inverter in clock circuits to generate separate clock signals that are provided to memory elements. According to a first technique, individual clock signals are assigned to each LUTRAM column, and reduce a count of LUTRAM columns affected by SET, and therefore reduce the number of bit upsets by a factor of 2. According to a second technique, the clock signals of the LUTRAM pass gates are interleaved, and also reduce the probability of SET induced bit upsets by a factor of 2.

Figure 1:
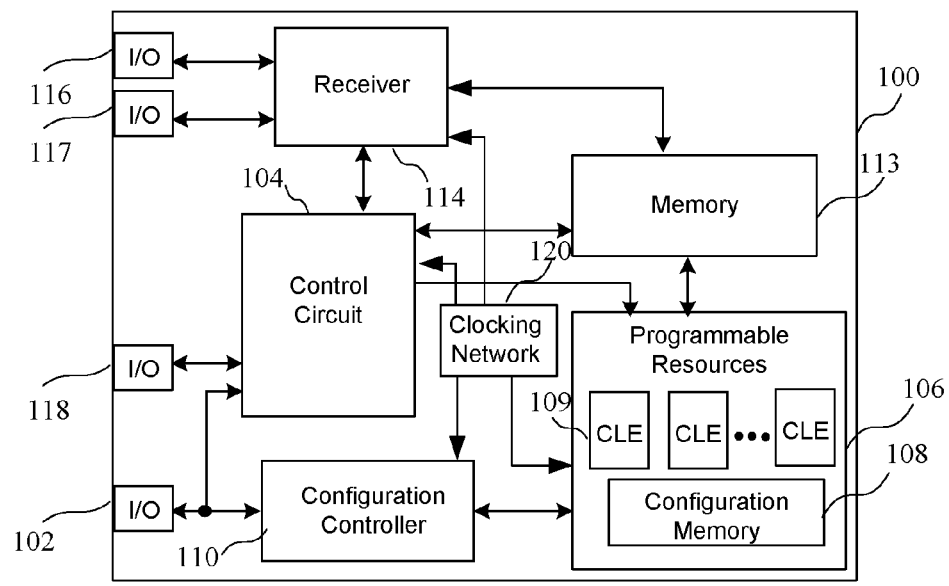
FIG. 1 is a block diagram of an integrated circuit comprising a clocking element and memory.

Turning first to FIG. 1, a block diagram of an integrated circuit comprising a clocking element and memory is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1.

Figure 2:
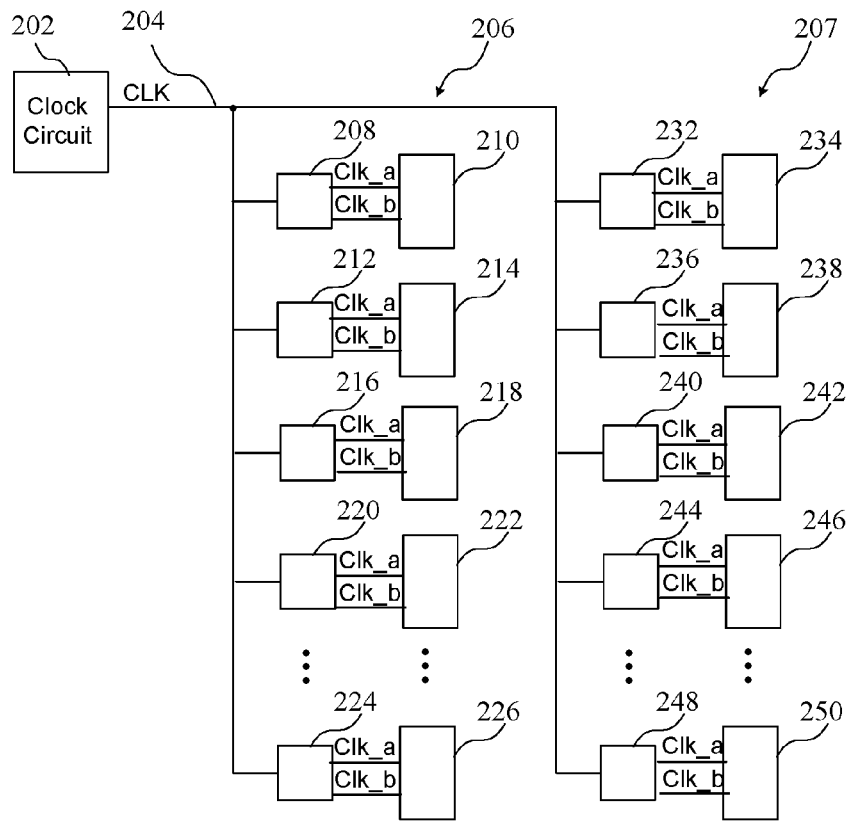
FIG. 2 is a block diagram of an arrangement of a clock circuit and memory.

Turning now to FIG. 2, a block diagram of an arrangement of a clock circuit and memory is shown. As shown in FIG. 2, a clock circuit 202 generates a clock signal (CLK), which may be considered a reference clock, on a clock signal line 204 coupled to a first column of memory elements 206 and to a second column of memory elements 207. Each column of memory elements comprises a clock generator coupled to receive the clock signal and generate a corresponding plurality of clock signals (shown here as a first clock signal (Clk_a) and a second clock signal (Clk_b)) that are coupled to the memory elements. More particularly, a first local clock generator 208 is coupled to receive the CLK signal and generate the first and second clock signals that are coupled to the memory element 210. As will be described in more detail below in reference to FIG. 3, the memory element 210 may comprise a plurality of memory elements, which may be connected to enable the routing of output signals of a memory element of the column of memory elements 206 to the second column of memory elements 207. Corresponding clock generator-memory element pairs 212-214, 216-218, 220-222 are 224-226 are also implemented. Similarly, for the second column of memory elements 207, corresponding second clock generator-memory element pairs 232-234, 236-238, 240-242, 244-246, and 248-250 are also implemented. As will be described in more detail below, the first and second clock signals are the same clock signal (i.e. they have at least the same approximate frequency and phase), but are generated at a separate output of the clock generator and are therefore not likely to be affected by the same radiation strike, reducing the impact of the radiation strike.

Figure 3:
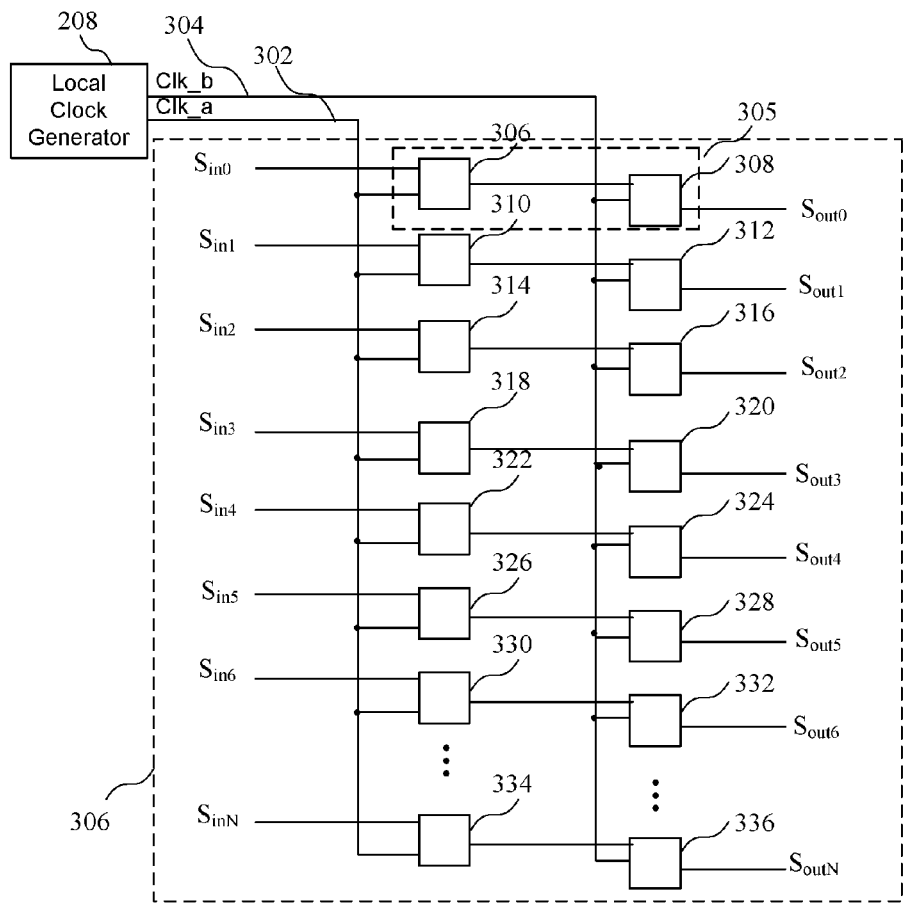
FIG. 3 is a block diagram of a clock circuit and a plurality of memory elements according to a first implementation.

Turning now to FIG. 3, a block diagram of a clock circuit and a plurality of memory elements according to a first implementation is shown. As shown in FIG. 3, a local clock generator 208 generates a first clock signal Clk_a on a clock signal line 302 and a second clock signal Clk_b on a second clock signal line 304. Pairs of memory elements, which may be CLEM elements that will be described in more detail in reference to FIG. 9, for example, are coupled together, where a first memory element 306 is coupled to receive an input signal ($S_{in0}$), and generate an output signal at an output which is coupled to an input of the second memory element. An output signal ($S_{out0}$) is generated at an output of the second memory element 308. Other input and output signals are routed in the corresponding memory element pairs, including pairs 310-312, 314-316, 318-320, 322-324, 326-328, 330-332 and 334-336, where each pair of memory elements has a memory element from a first column and a memory element from a second column as shown. As will be described in more detail below in reference to FIG. 4, memory elements in the first column receive the first clock signal (Clk_a) while memory elements in the second column receive the second clock (Clk_b).

Figure 4:
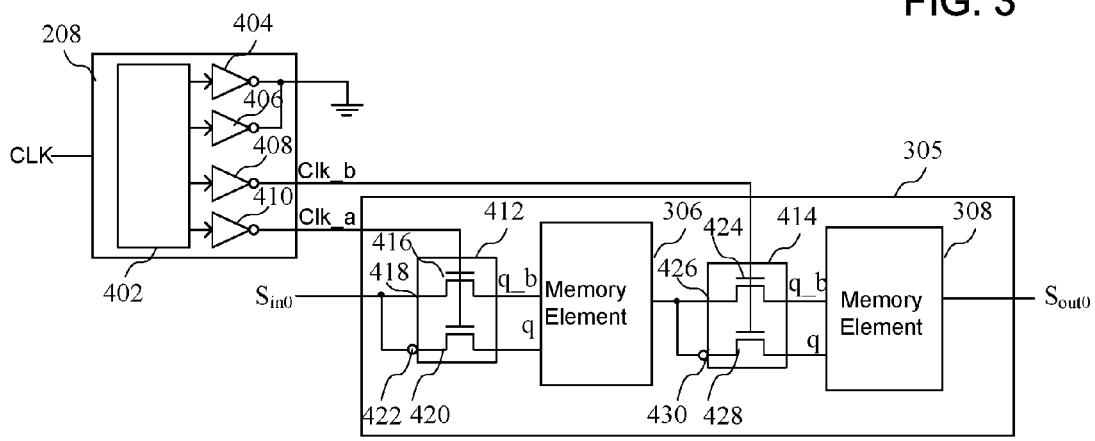
FIG. 4 is a block diagram showing a clock circuit configured to route clock signals to first and second memory elements of the circuit of FIG. 3.

As shown in FIG. 4, the local clock generator 208 comprises a logic circuit 402 enabling the generation of clock signals at separate outputs of the local clock generator 208. By way of example, 4 inverters 404-410 are shown, where the outputs of inverter 404 and 406 are coupled to ground, and Clk_a is generated at an output of the inverter 408 and Clk_b is generated at an output of the inverter 410. It should be noted that inverters 404 and 406 could be used to generated different clock signals for other memory elements in other implementations.

The pair of memory elements 305 for example comprises gating circuitry enabling the coupling of input signals and inverted input signals to inputs of the memory elements. More particularly, a first gating circuit 412 and a second gating circuit 414 are implemented. The first gating circuit 412 comprises a first pass gate 416 (shown here as a transistor) configured to receive the input signal ($S_{in0}$) at an input 418 and the Clk_a signal at a control terminal of the pass gate. An inverted input signal is coupled to a second pass gate 420 at an input 422, where the control terminal of the pass gate 420 is also configured to receive the Clk_a signal. Outputs of the pass gates are coupled to corresponding inputs of the memory element 306.

Similarly, the second gating circuit 414 comprises a first pass gate 424 configured to receive an output of the memory element at an input 426 and the Clk_b signal at a control terminal of the pass gate. An inverted output signal is coupled to a second pass gate 428 at an input 430, where the control terminal of the pass gate 428 is also configured to receive the Clk_b signal. Outputs of the pass gates are coupled to corresponding inputs of the memory element 306. As is apparent in FIG. 4, the first memory element of the pair of memory elements (i.e. the memory element in the first column) is configured to receive one of the two, separate clock signals generated by the local clock generator 208, and the second memory element of the pair of memory elements (i.e. the memory element in the second column) is configured to receive the other clock signal of the two clock signals.

SETs in an SRL clock circuit, such as a clock circuit for generating clock signals to LUTRAMs of an FPGA, can lead to erroneous data to be latched in LUTRAMs and generate abnormally large multi-bit upsets (MBUs). These events are uncorrectable because they are larger than the implemented interleaving strategy size. A single ion strike may cause one or more voltage pulses/glitches, or single-event transients (SETs), to propagate through the circuit. If a SET occurs on Clk_a and pass gates 416 and 420 are on, a corrupted input signal $S_{in0}$ (e.g. an erroneous logic "1") forces q_b to 1. This erroneous value may be latched into 2×16 LUTRAMs of an array receiving the clock signal. Because interleaving is 8:1, the events are uncorrectable. Therefore, 32 bits are upset by the SET. The additional inverters required to generate the extra clock signal has a small impact on the LUTRAMs performance and increase the CLEM area by less than 2%.

Figure 5:
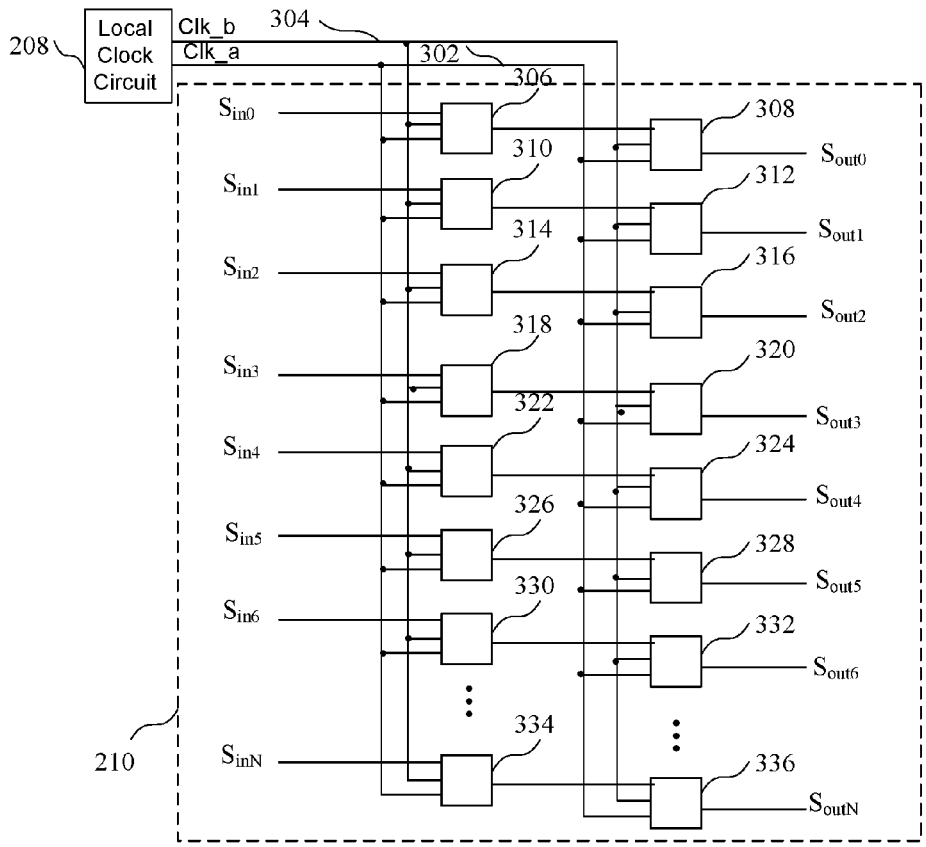
FIG. 5 is a block diagram of a clock circuit and a plurality of memory elements according to a second implementation.
Figure 6:
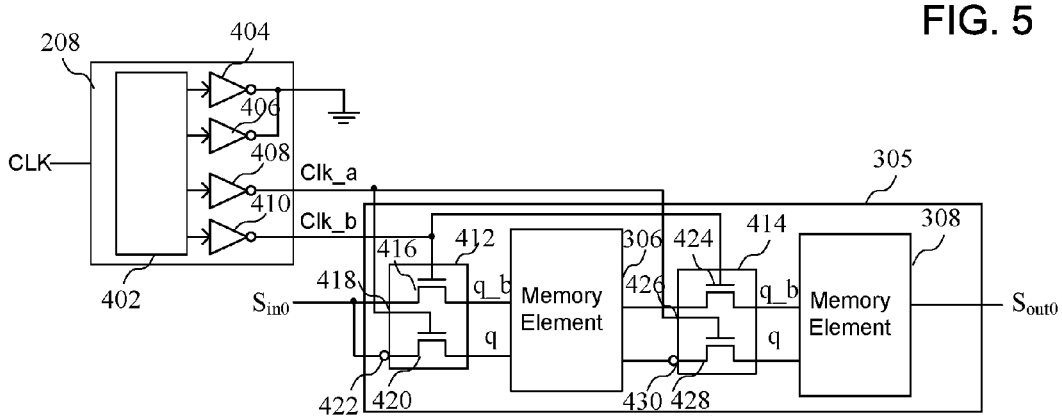
FIG. 6 is a block diagram showing a clock circuit configured to route clock signals to first and second memory elements of the circuit of FIG. 5.

Turning now to FIGS. 5 and 6, a block diagram of a clock circuit and a plurality of memory elements according to a second implementation is shown. According to the implementation of FIGS. 5 and 6, each memory elements receives both the first clock signal (Clk_a) and the second clock signal (Clk_b). While the circuits of FIGS. 4 and 6 provide the same reduction in the impact of an ion strike on a memory array, FIGS. 4 and 6 represent configurations of a circuit for preventing multi-bit upsets induced by single event transients.

Figure 7:
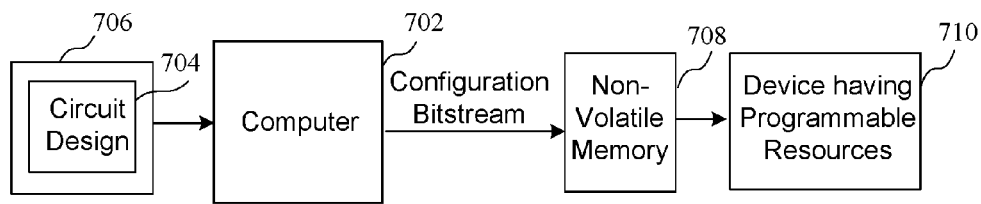
FIG. 7 is a block diagram of a system for programming a device having programmable resources.

Turning now to FIG. 7, a block diagram of a system for programming a device having programmable resources according to an embodiment is shown. In particular, a computer 702 is coupled to receive a circuit design 704 from a memory 706, and generates a configuration bitstream that is stored in the non-volatile memory 706. As will be described in more detail below, the circuit design may be a high level design, such as a circuit design defined in a hardware description language (HDL). Also, the computer may be configured to run software that generates a configuration bitstream that is stored in the non-volatile memory 708 and provided to an integrated circuit 710 that may be a programmable integrated circuit, such as the integrated circuit described below in FIG. 8. As will be described in more detail below, bits of the configuration bitstream are used to configure programmable resources of the integrated circuit.

Figure 8:
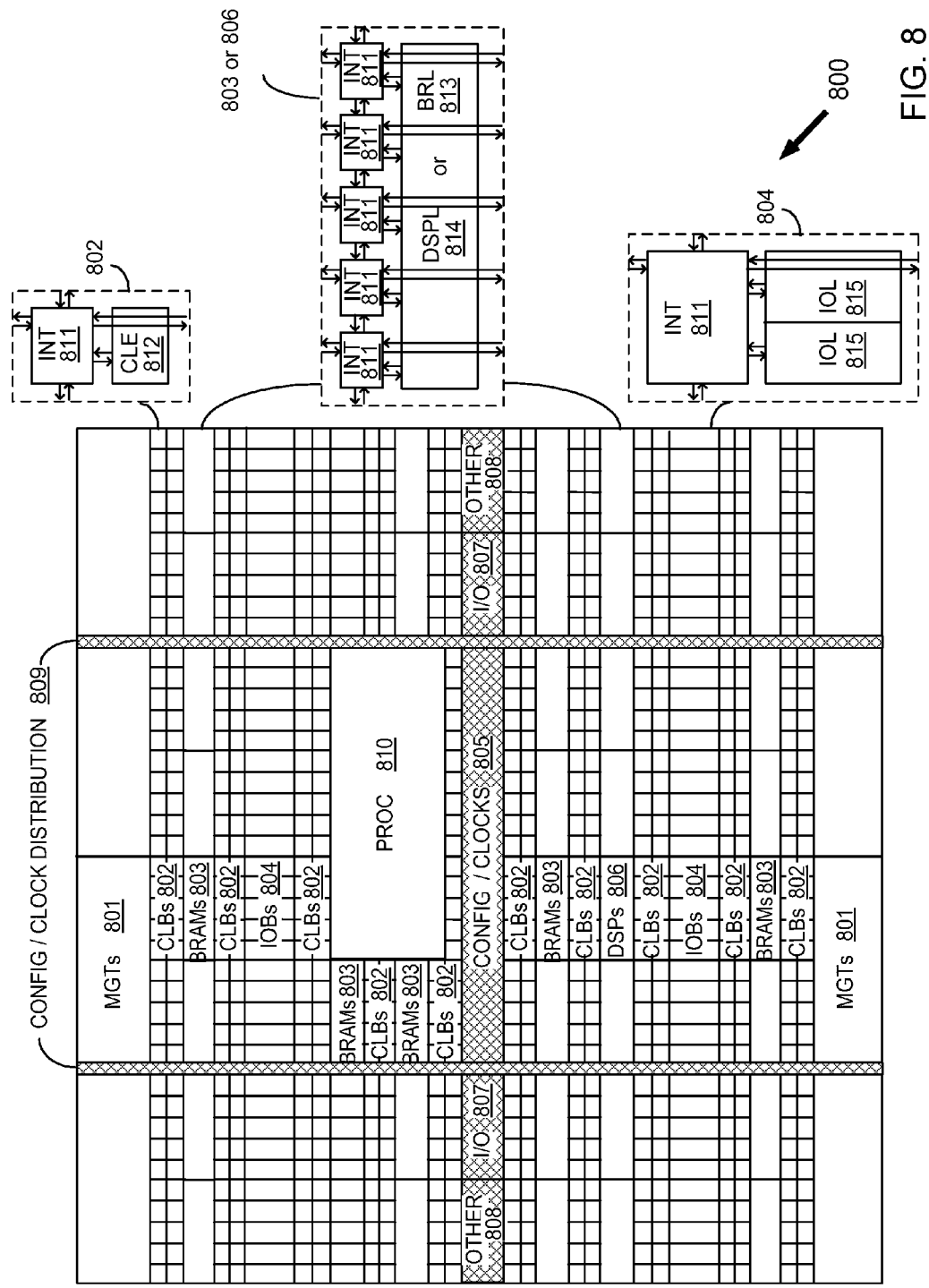
FIG. 8 is a block diagram of a device having programmable resources.

Turning now to FIG. 8, a block diagram of a device having programmable resources including the circuits of FIGS. 1-6 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 8 comprises an FPGA architecture 800 having a large number of different programmable tiles including multi-gigabit transceivers (MGTs) 801, CLBs 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807 (e.g., configuration ports and clock ports), and other programmable logic 808 such as digital clock managers, analog-to-digital converters, system monitoring logic, and so forth. Some FPGAs also include dedicated processor blocks (PROC) 810, which may be used to implement a software application, for example.

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 may include a configurable logic element (CLE) 812 that may be programmed to implement user logic plus a single programmable interconnect element 811. A BRAM 803 may include a BRAM logic element (BRL) 813 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 806 may include a DSP logic element (DSPL) 814 in addition to an appropriate number of programmable interconnect elements. An IOB 804 may include, for example, two instances of an input/output logic element (IOL) 815 in addition to one instance of the programmable interconnect element 811. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear in order to facilitate the efficient implementation of user logic. While the embodiment of FIG. 8 relates to an integrated circuit having programmable resources, it should be understood that the circuits and methods set forth in more detail below could be implemented in any type of ASIC.

Figure 9:
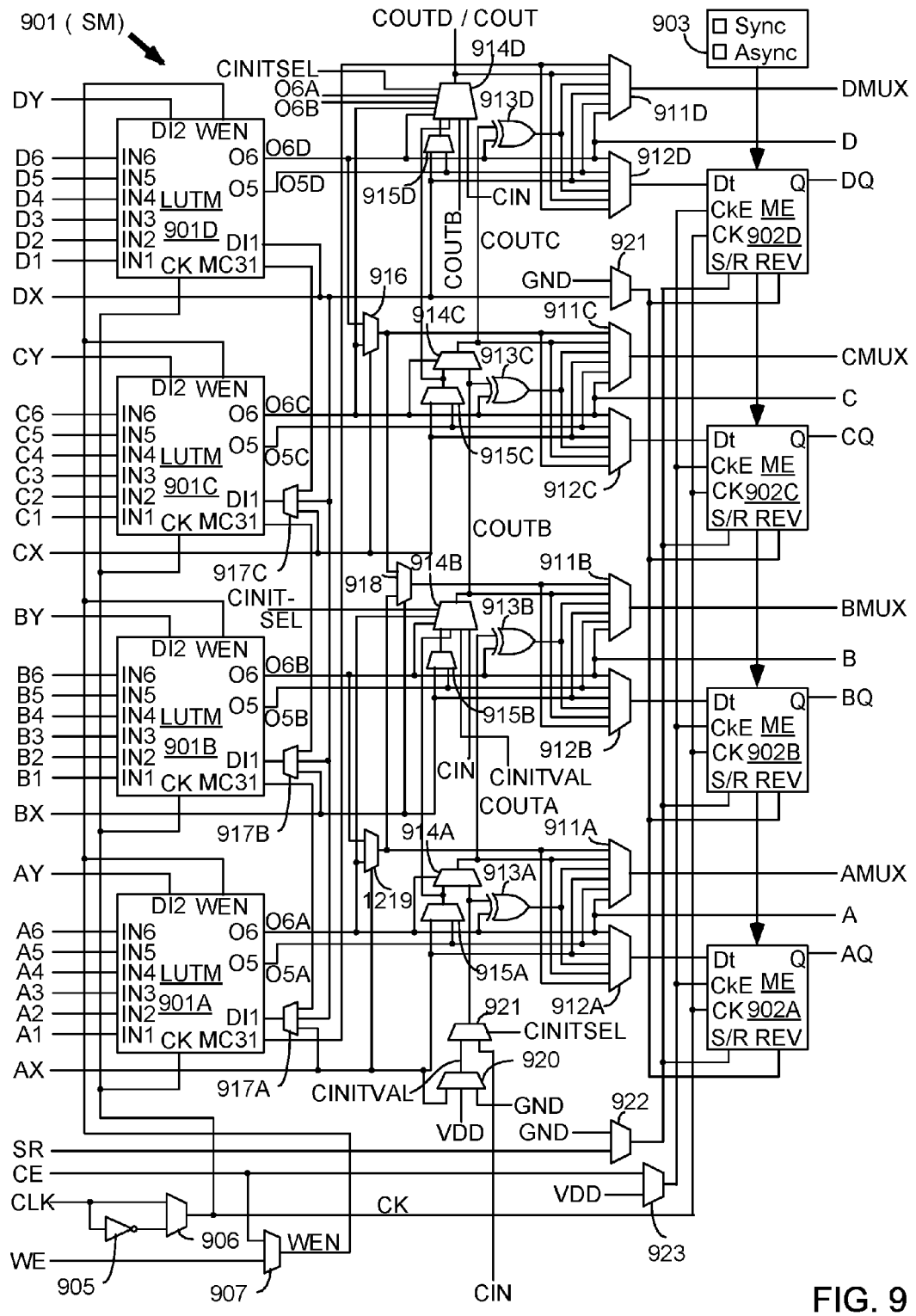
FIG. 9 is a block diagram of a configurable logic element of the device of FIG. 8.

Turning now to FIG. 9, block diagram of a configurable logic element of the device of FIG. 8 is shown. In particular, FIG. 9 illustrates in simplified form a configurable logic element of a configuration logic block 802 of FIG. 8. In the embodiment of FIG. 9, slice M 901 includes four lookup tables (LUTMs) 901A-901D, each driven by six LUT data input terminals A1-A6, B1-B6, C1-C6, and D1-D6 and each providing two LUT output signals O5 and O6. The O6 output terminals from LUTs 901A-2401D drive slice output terminals A-D, respectively. The LUT data input signals are supplied by the FPGA interconnect structure via input multiplexers, which may be implemented by programmable interconnect element 911, and the LUT output signals are also supplied to the interconnect structure. Slice M also includes: output select multiplexers 911A-911D driving output terminals AMUX-DMUX; multiplexers 912A-912D driving the data input terminals of memory elements 902A-902D; combinational multiplexers 916, 918, and 919; bounce multiplexer circuits 922-923; a circuit represented by inverter 905 and multiplexer 906 (which together provide an optional inversion on the input clock path); and carry logic having multiplexers 914A-914D, 915A-915D, 920-921 and exclusive OR gates 913A-913D. All of these elements are coupled together as shown in FIG. 9. Where select inputs are not shown for the multiplexers illustrated in FIG. 9, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 9 for clarity, as well as from other selected figures herein.

In the pictured embodiment, each memory element 902A-902D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 902A-902D are clocked by a clock signal CK, which may be provided by a global clock network or by the interconnect structure, for example. Such programmable memory elements are well known in the art of FPGA design. Each memory element 902A-902D provides a registered output signal AQ-DQ to the interconnect structure. Because each LUT 901A-901D provides two output signals, O5 and O6, the LUT may be configured to function as two 5-input LUTs with five shared input signals (IN1-IN5), or as one 6-input LUT having input signals IN1-IN6.

In the embodiment of FIG. 9, each LUTM 901A-901D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 917A-917C for LUTs 901A-901C), or to the two 32-bit RAMs via input terminals DI1 and DI2. RAM write operations in the LUT RAMs are controlled by clock signal CK from multiplexer 906 and by write enable signal WEN from multiplexer 907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 901A may also be provided to the general interconnect structure for shift register chaining, via output select multiplexer 911D and CLE output terminal DMUX. Accordingly, the circuits and methods set forth above may be implemented in a device such as the devices of FIGS. 8 and 9, or any other suitable device.

Figure 10:
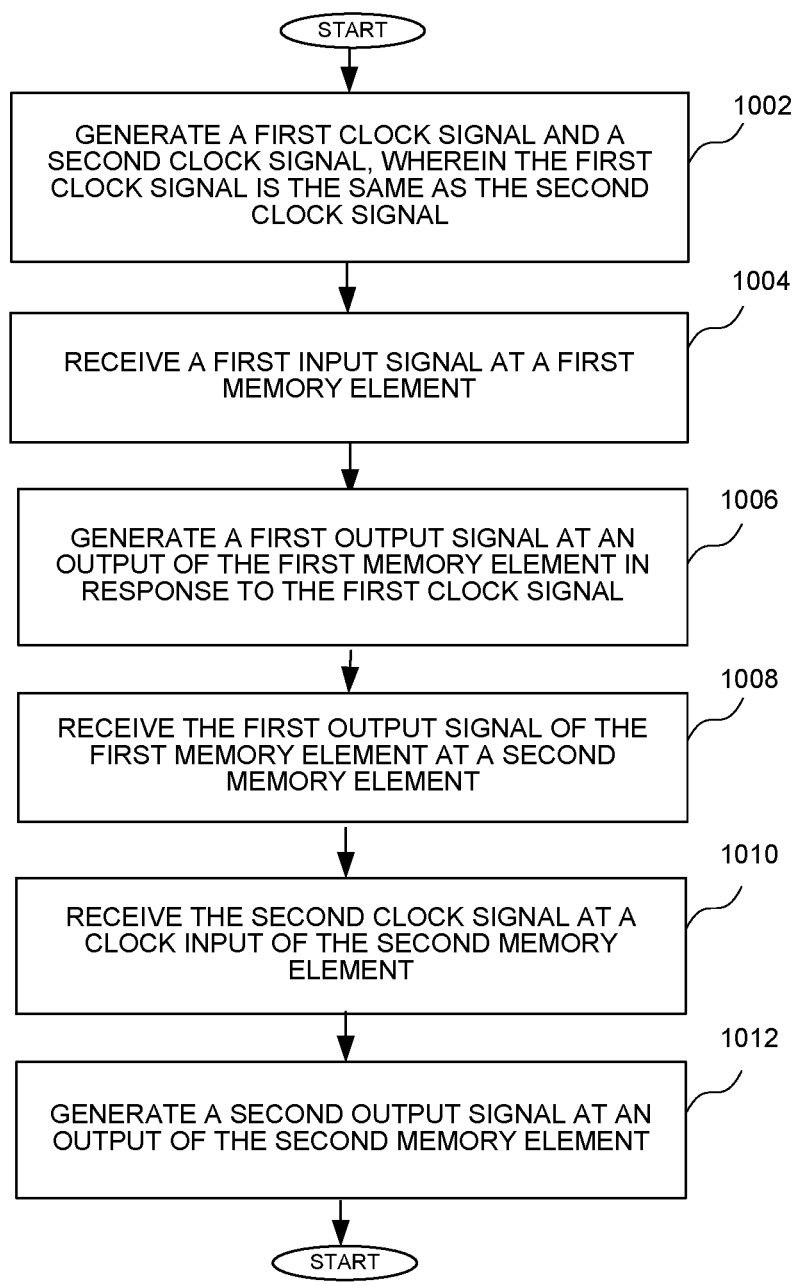
FIG. 10 is a flow chart showing a method of preventing multi-bit upsets induced by single event transients.

Turning now to FIG. 10 is a flow chart showing a method of preventing multi-bit upsets induced by single event transients. A first clock signal and a second clock signal are generated at a block 1002, wherein the first clock signal is the same as the second clock signal. That is, Clk_a and Clk_b may represent the first and second clock signals as set forth above. A first input signal is received at a first memory element at a block 1004. A first output signal is generated at an output of the first memory element in response to the first clock signal at a block 1006. The first output of the first memory element is received at a second memory element at a block 1008. The first and second memory elements could include memory elements of the pairs of memory elements as set forth above. The second clock signal is received at a clock input of the second memory element at a block 1010. A second output signal is generated at an output of the second memory element at a block 1012. The method of FIG. 10 could be implemented using the circuits of FIGS. 1-9 as described above, or other suitable circuits.

It can therefore be appreciated that new circuits for and methods of preventing multi-bit upsets induced by single event transients have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for preventing multi-bit upsets induced by single event transients, the circuit comprising:
   a clock generator configured to generate a first clock signal and a second clock signal;
   a first memory element configured to receive a first input signal and generate a first output signal, the first memory element having a first clock input configured to receive the first clock signal; and
   a second memory element configured to receive the first output signal and generate a second output signal, the second memory element having a second clock input configured to receive the second clock signal;
   wherein the first clock signal is the same as the second clock signal; and
   wherein each of the first memory element and the second memory element is configured to receive both the first clock signal and the second clock signal to control the routing of the input signal and an inverted input signal to the first memory element and the routing of the first output signal and an inverted first output signal to the second memory element.

2. The circuit of claim 1 wherein the first clock signal and the second clock signal are selectively coupled to the first memory element and the second memory element to prevent a multi-bit upset induced by a single event transient at a clock input of the first memory element or the second memory element.

3. The circuit of claim 1 further comprising a first pass gate configured to receive the first input signal and to receive the first clock signal at a first control terminal, the first pass gate enabling the routing of the input signal to a first input of the first memory element, and a second pass gate configured to receive the inverted input signal and to receive the second clock signal at a second control terminal, the second pass gate enabling the routing of the inverted input signal to a second input of the first memory element.

4. The circuit of claim 3 further comprising a third pass gate configured to receive the first output and the first clock signal at a third control terminal, the third pass gate enabling routing of the input signal to a first input of the second memory element, and a fourth pass gate configured to receive the inverted first output signal and the second clock signal at a fourth control terminal, the fourth pass gate enabling routing of the inverted first output signal to a second input of the second memory element.

5. The circuit of claim 1 wherein the clock generator comprises a local clock generator associated with a predetermined number of memory elements.

6. The circuit of claim 1 further comprising a clocking network configured to provide a reference clock to a plurality of local clock generators, wherein each local clock generator of the plurality of local clock generators provides a first local clock signal and a second local clock signal to a predetermined number of memory elements.

7. The circuit of claim 1 wherein the first memory element and the second memory element comprise configurable logic elements.

8. A method of preventing multi-bit upsets induced by single event transients, the method comprising:
configuring a clocking network to provide a reference clock to a plurality of local clock generators, wherein each local clock generator of the plurality of local clock generators provides a first local clock signal and a second local clock signal to a predetermined number of memory elements;
generating the first local clock signal and the second local clock signal, wherein the first local clock signal is the same as the second local clock signal;
receiving a first input signal at a first memory element;
generating a first output signal at an output of the first memory element in response to the first local clock signal;
receiving the first output of the first memory element at a second memory element;
receiving the second local clock signal at a clock input of the second memory element; and
generating a second output signal.

9. The method of claim 8 further comprising selectively coupling the first local clock signal and the second local clock signal to the first memory element and the second memory element to prevent a multi-bit upset induced by a single event transient at a local clock input of the first memory element or the second memory element.

10. The method of claim 8 further comprising configuring a first pass gate to receive an input signal and to receive the first local clock signal at a first control terminal, the first pass gate enabling routing of the first input signal to a first input of the first memory element, and configuring a second pass gate to receive an inverted first input signal and to receive the first local clock signal at a second control terminal, the second pass gate enabling routing of the inverted local input signal to a second input of the first memory element.

11. The method of claim 10 further comprising configuring a third pass gate to receive the first output signal and to receive the second local clock signal at a third control terminal, the third pass gate enabling routing of the first output signal to a first input of the second memory element, and configuring a fourth pass gate to receive an inverted first output signal and to receive the second local clock signal at a fourth control terminal, the fourth pass gate enabling routing of the inverted first output signal to a second input of the second memory element.

12. The method of claim 8 further comprising configuring each of the first memory element and the second memory element to receive both the first local clock signal and the second local clock signal to control the routing of the input signal and an inverted input signal to the first memory element and the routing of the first output signal and an inverted first output signal to the second memory element.

13. The method of claim 8 further comprising configuring a first pass gate to receive the first input signal and to receive the first local clock signal at a first control terminal, the first pass gate enabling routing of the input signal to a first input of the first memory element, and configuring a second pass gate to receive an inverted input signal and to receive the second local clock signal at a second control terminal, the second pass gate enabling routing of the inverted input signal to a second input of the first memory element.

14. The method of claim 13 further comprising configuring a third pass gate to receive the first output and to receive the first local clock signal at a third control terminal, the third pass gate enabling routing of the input signal to a first input of the second memory element, and configuring a fourth pass gate to receive an inverted output signal and to receive the second local clock signal at a fourth control terminal, the fourth pass gate enabling routing of the inverted output signal to a second input of the second memory element.

15. The method of claim 8 wherein generating the first local clock signal and the second local clock signal comprises implementing a local clock generator associated with a predetermined number of memory elements.

16. The method of claim 8 wherein the first memory element and the second memory element comprise configurable logic elements.

* * * * *